(12) United States Patent
Ferris et al.

(10) Patent No.: US 9,793,912 B1
(45) Date of Patent: Oct. 17, 2017

(54) ANALOG-TO-DIGITAL CONVERSION CIRCUITRY WITH REAL-TIME ADJUSTED GAIN AND RESOLUTION

(71) Applicant: Western Digital Technologies, Inc., Irvine, CA (US)

(72) Inventors: Timothy A. Ferris, Mission Viejo, CA (US); Jaesoo Byoun, Irvine, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/390,885

(22) Filed: Dec. 27, 2016

(51) Int. Cl.
  *G11B 5/09* (2006.01)
  *H03M 1/12* (2006.01)
  *H03M 1/18* (2006.01)
  *G11B 5/02* (2006.01)
  *G11B 20/10* (2006.01)

(52) U.S. Cl.
  CPC ............ *H03M 1/1245* (2013.01); *G11B 5/02* (2013.01); *G11B 20/10037* (2013.01); *H03M 1/18* (2013.01)

(58) Field of Classification Search
  None
  See application file for complete search history.

(56) References Cited

U.S. PATENT DOCUMENTS

| | | | |
|---|---|---|---|
| 4,710,825 A * | 12/1987 | Okita | G11B 19/28 358/906 |
| 5,532,889 A * | 7/1996 | Stefansky | G11B 5/4806 360/245.2 |
| 6,269,059 B1 * | 7/2001 | Kuroda | G11B 20/10 369/124.14 |
| 6,282,045 B1 * | 8/2001 | Glover | G06F 3/0626 360/73.03 |
| 6,639,539 B1 | 10/2003 | Loreck | |
| 6,721,119 B1 * | 4/2004 | Hassan | G11B 5/5526 360/75 |
| 6,731,232 B1 * | 5/2004 | Kearney | H03M 1/129 341/144 |
| 7,193,553 B1 | 3/2007 | Bahai | |
| 7,271,758 B2 | 9/2007 | Piasecki et al. | |
| 7,440,209 B1 * | 10/2008 | Sutardja | G11B 20/10009 360/39 |
| 7,561,091 B1 | 7/2009 | Muenter et al. | |
| 7,911,370 B2 | 3/2011 | Chou | |
| 8,035,622 B2 | 10/2011 | Hotelling et al. | |
| 8,730,074 B1 | 5/2014 | Cowley et al. | |
| 9,520,189 B1 * | 12/2016 | Papandreou | G11C 13/0033 |
| 2003/0072230 A1 * | 4/2003 | Yanagawa | G11B 7/005 369/47.22 |
| 2004/0012697 A1 * | 1/2004 | Rossi | H04N 5/3537 348/308 |

(Continued)

*Primary Examiner* — Peter Vincent Agustin

(57) ABSTRACT

Analog-to-digital conversion circuitry for generating a digital output signal is disclosed comprising a sample-and-hold circuit comprising an adjustable sample capacitor for coupling to an analog input signal during a sample phase, and an analog-to-digital converter (ADC) coupled to an output of the sample-and-hold circuit during a hold phase. In order to compensate in real-time for an increase in an amplitude of the input signal, a capacitance of the sample capacitor is decreased by an attenuation factor, and an output of the ADC is multiplied by an inverse of the attenuation factor to generate the digital output signal.

16 Claims, 8 Drawing Sheets

(56) References Cited

U.S. PATENT DOCUMENTS

| | | | |
|---|---|---|---|
| 2007/0277060 A1* | 11/2007 | Cornwell | G11C 11/5628 |
| | | | 714/54 |
| 2007/0291904 A1* | 12/2007 | Takenaka | G01N 23/04 |
| | | | 378/207 |
| 2009/0024904 A1* | 1/2009 | Roohparvar | G06F 11/1068 |
| | | | 714/773 |
| 2015/0378815 A1* | 12/2015 | Goda | G06F 11/1068 |
| | | | 714/764 |
| 2016/0248437 A1 | 8/2016 | Zhang et al. | |

* cited by examiner

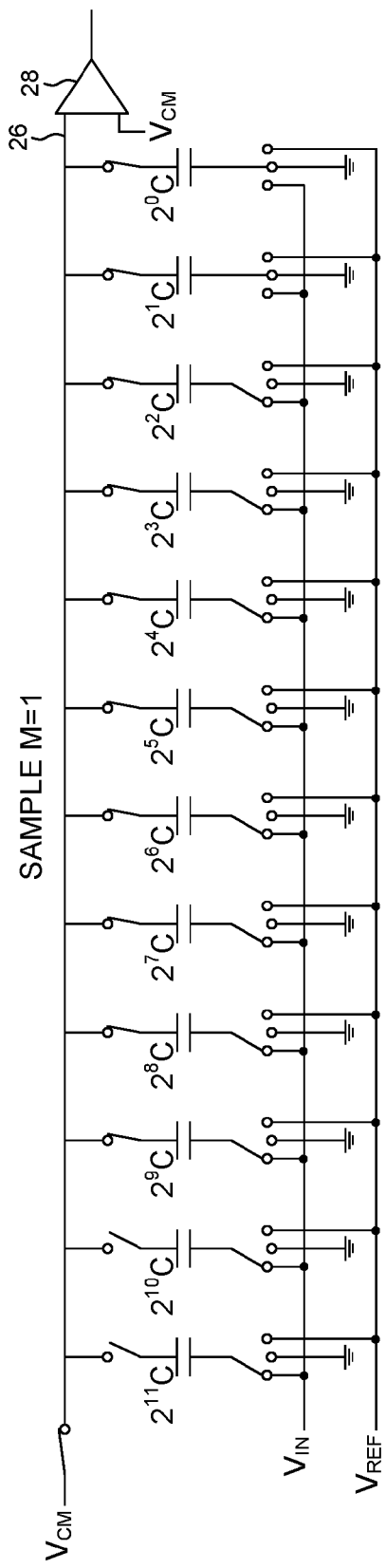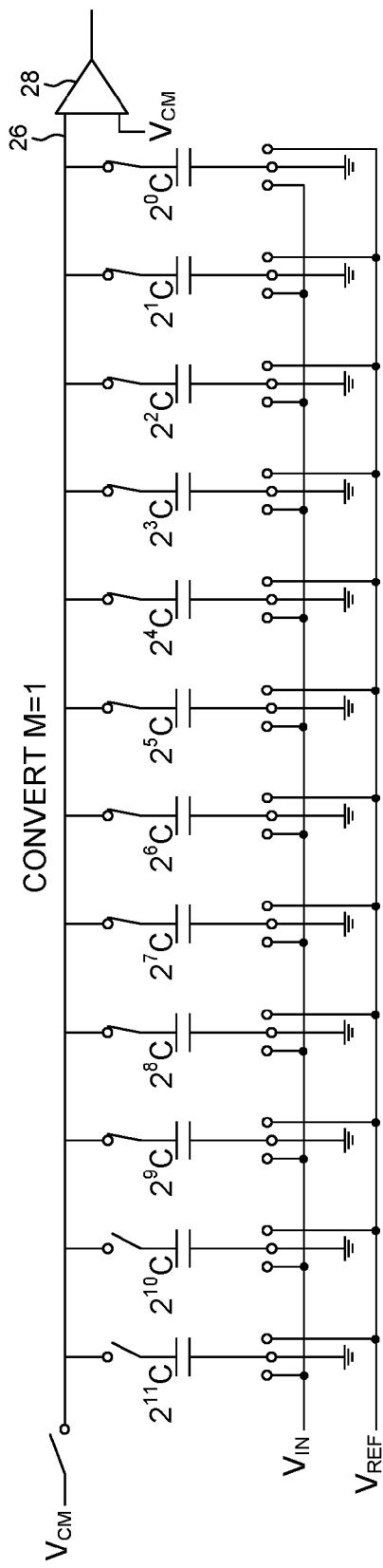
FIG. 6A
FIG. 6B

ANALOG-TO-DIGITAL CONVERSION CIRCUITRY WITH REAL-TIME ADJUSTED GAIN AND RESOLUTION

BACKGROUND

Analog-to-digital converters (ADCs) are used in many different applications for converting continuous time analog signals into digital signals for processing in the digital domain, for example, using a microprocessor. As an example, data storage devices (e.g., disk drives) may employ a shock sensor for detecting disturbances that may adversely affect the normal operation of the storage device. The shock sensor may comprise, for example, a piezoelectric element that may generate an analog sensor signal representing the magnitude of a disturbance affecting the storage device. The analog sensor signal may be converted into a digital sensor signal using a suitable ADC, and the digital sensor signal may be processed to perform any suitable operation, such as unloading heads off of disk surfaces to prevent damage to the heads, or generating a servo control feed-forward compensation signal in order to compensate for the disturbance during access operations (write/read operations).

BRIEF DESCRIPTION OF THE DRAWINGS

FIGS. 6A and 6B show an embodiment wherein the adjustable resolution ADC comprises a successive approximation register (SAR) ADC comprising a plurality of binary weighted capacitors forming a suitable capacitor network, including a plurality of active binary weighted capacitors and at least one inactive binary weighted capacitor.

DETAILED DESCRIPTION

Figure 1A:
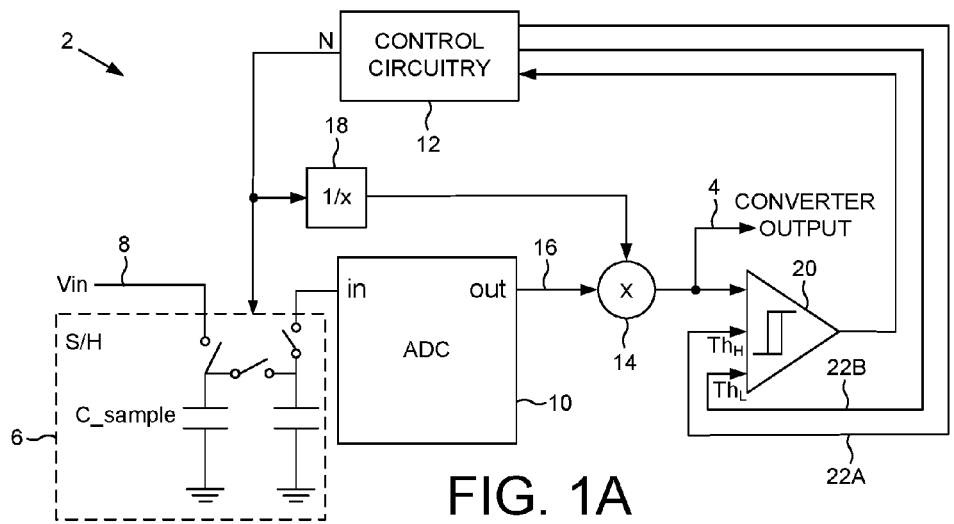
FIG. 1A shows analog-to-digital conversion circuitry for generating a digital output signal according to an embodiment comprising a sample-and-hold circuit having an adjustable sample capacitor for real-time adjusting a gain of the conversion circuitry, and a multiplier for real-time adjusting a resolution of an analog-to-digital converter (ADC).

FIG. 1A shows analog-to-digital conversion circuitry 2 for generating a digital output signal 4 according to an embodiment comprising a sample-and-hold circuit 6 comprising an adjustable sample capacitor for coupling to an analog input signal 8 during a sample phase, and an analog-to-digital converter (ADC) 10 coupled to an output of the sample-and-hold (S/H) circuit 6 during a hold phase. The analog-to-digital conversion circuitry 2 further comprises control circuitry 12 configured to compensate for an increase in an amplitude of the input signal 8 in real-time by decreasing a capacitance of the sample capacitor by an attenuation factor N, and multiplying 14 an output 16 of the ADC by an inverse 18 of the attenuation factor N to generate the digital output signal 4.

Figure 1B:
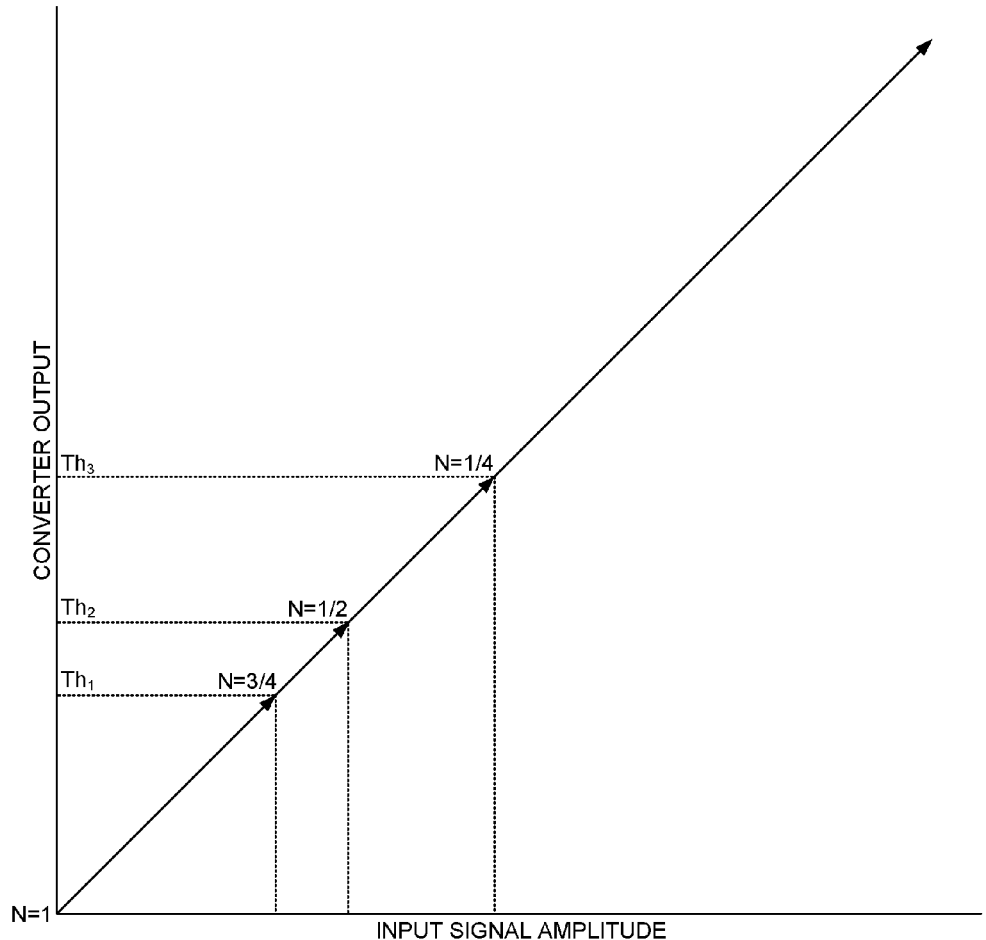
FIG. 1B shows an embodiment wherein as the amplitude of the analog input signal increases, the capacitance of the sample capacitor is decreased by an attenuation factor N to decrease the gain of the conversion circuitry, and the output of the ADC is multiplied by the inverse of the attenuation factor N.

FIG. 1B shows an embodiment wherein as the amplitude of the analog input signal 8 increases, the capacitance of the sample capacitor in the S/H circuit 6 is decreased to decrease the gain of the conversion circuitry 2. In the example of FIG. 1B, the control circuitry initializes the capacitance of the sample capacitor to a maximum value by configuring the attenuation factor N to 1, thereby initializing the resolution of the conversion circuitry 2 to a maximum value. If the amplitude of the input signal 8 increases such that the digital output signal 4 exceeds a first threshold $Th_1$ at comparator 20, the control circuitry 12 decreases the capacitance of the sample capacitor to N=¾ of the maximum value. In one embodiment, the comparator 20 comprises a hysteretic threshold such that if the amplitude of the input signal 8 decreases, the control circuitry 12 does not increase the capacitance of the sample capacitor until the digital output signal 4 falls below a threshold lower than $Th_1$ by a predetermined offset. Accordingly, in the embodiment of FIG. 1A the control circuitry 12 configures the comparator 20 with a high threshold $Th_H$ 22A and a low threshold $Th_L$ 22B in order to achieve the desired hysteresis. For example, when the amplitude of the digital output signal 4 exceeds the threshold $Th_1$, the control circuitry 12 configures the high threshold $Th_H$ 22A to $Th_2$ and the low threshold $Th_L$ 22B to $Th_1$ minus an offset. If the amplitude of the analog input signal 8 continues to increase such that the digital output signal 4 exceeds the high threshold $Th_H=Th_2$, the control circuitry 12 further decreases the capacitance of the sample capacitor to N=½ of the maximum value, and adjusts the high threshold $Th_H$ to $Th_3$ and the low threshold $Th_L$ to $Th_2$ minus an offset. The control circuitry 12 achieves a similar hysteresis at comparator 20 as the amplitude of the digital output signal 4 decreases below the low threshold $Th_L$ by configuring the high threshold $Th_H$ to $Th_i$. In an alternative embodiment, the comparator 20 may operate without hysteresis such that the upper threshold $Th_H$ and the lower threshold $Th_L$ may be assigned to $Th_i$ and $Th_{i-1}$ respectively.

In one embodiment, decreasing the capacitance of the sample capacitor in the S/H circuit 6 decreases the gain of the analog-to-digital conversion circuitry 2. In order to compensate for this decrease in gain, in the embodiment of FIG. 1A the output 16 of the ADC 10 is multiplied at multiplier 14 by an inverse 18 of the attenuation factor N. This increases the quantization step of the conversion circuitry by a corresponding factor (decreases the resolution), which increases the signal noise due to the increase in the quantization error. However, in one embodiment the signal-to-noise ratio (SNR) of the analog input signal 8 increases as the amplitude of the input signal 8 increases, and so in one embodiment the conversion circuitry is able to maintain a desired SNR over the amplitude range of the input signal 8 even though the quantization noise of the conversion circuitry increases as the amplitude of the input signal 8 increases. Although the example of FIG. 1B shows four settings for the capacitance of the sample capacitor (four settings for N), any suitable number of settings may be employed to achieve any suitable adjustment to both the sample capacitance and the resolution of the ADC 10.

Figure 2A:
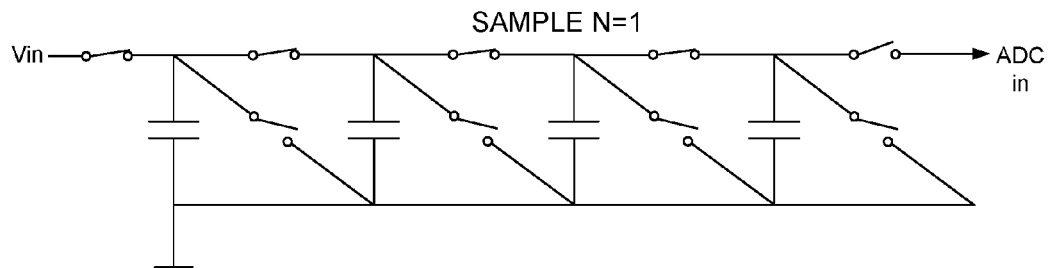
FIGS. 2A and 2B show an embodiment for the sample-and-hold circuit as comprising a plurality of capacitors connected in parallel to form a suitable capacitor network.
Figure 2B:
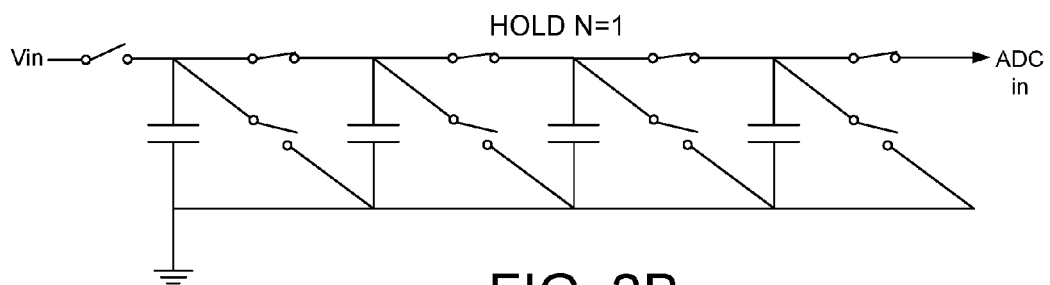
Figure 3A:
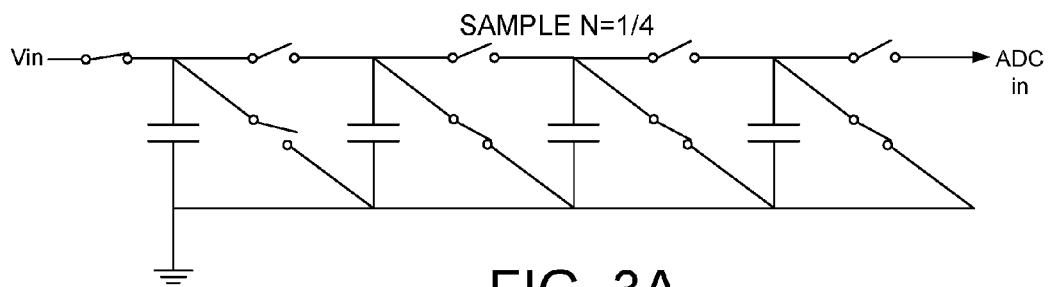
FIGS. 3A and 3B show an embodiment wherein the capacitance of the sample capacitor is decreased to one-fourth of its maximum value (N=¼) by disconnecting three of the parallel capacitors during the sample phase.
Figure 3B:
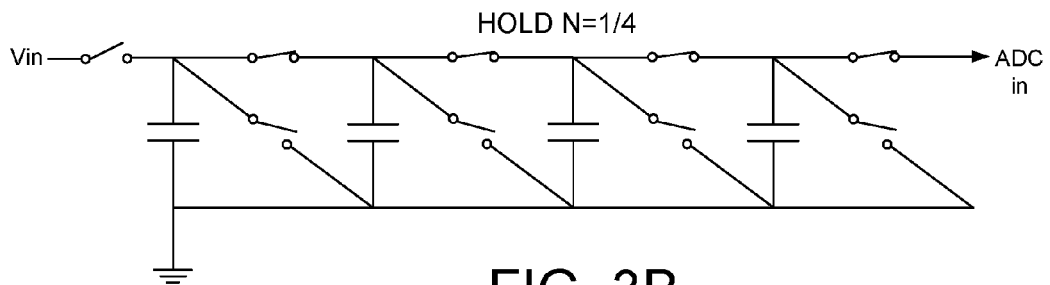

FIGS. 2A and 2B show an embodiment of a S/H circuit 6 comprising a plurality of capacitors connected in parallel, and a plurality of switches for configuring the sample capacitance during a sample phase, and configuring the capacitance during a hold phase. In the example of FIG. 2A, the switches are configured during the sample phase to connect all of the parallel capacitors to the input signal 8 such that the sample capacitance is at a maximum value and the corresponding charge Q=4C*Vin built up across the sample capacitance is at a maximum. During the hold phase as shown in FIG. 2B, the charge Q=4C*Vin stored across the capacitors is transferred to the input of the ADC. FIG. 3A shows an example for decreasing the sample capacitance to ¼ of the maximum value by disconnecting three of the parallel capacitors during the sample phase such that the built up charge is Q=1C*Vin. During the hold phase as shown in FIG. 3B, the built up charge Q=1C*Vin is distributed across all four capacitors such that the voltage across the capacitor network is reduced to Vin/4, which is the voltage level input into the ADC 10. In this example, each capacitor in the capacitor network comprises a substantially equal capacitance, and the switches of the capacitor network may be controlled so as to decrease the gain by an attenuation factor of 1, ¾, ½, or ¼; however, the capacitor network may comprise any suitable number of parallel capacitors each having any suitable capacitance so as to achieve any suitable level and number of gain attenuations.

Figure 4A:
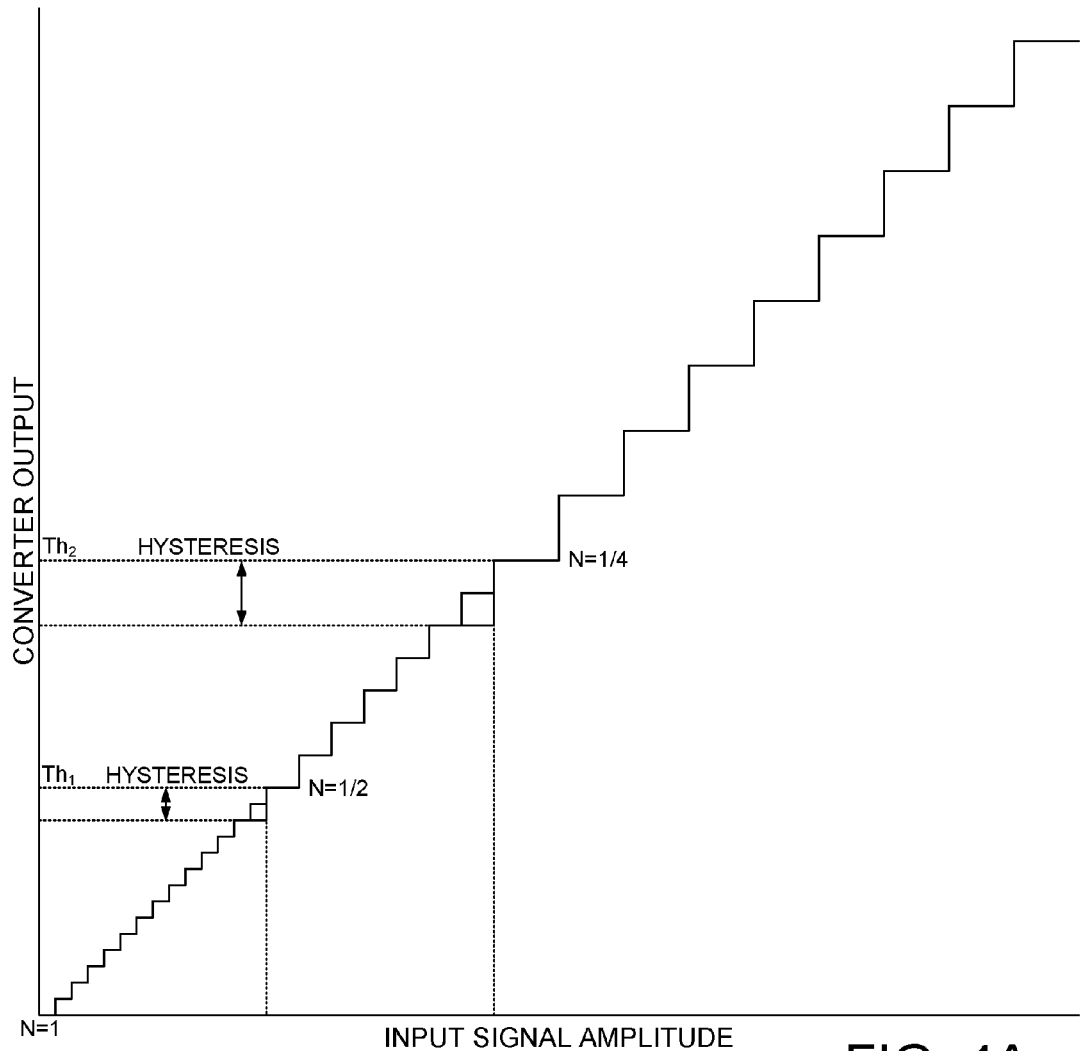
FIG. 4A shows an embodiment wherein the gain and resolution of the conversion circuitry are decreased in real-time to compensate for an increase in the amplitude of the input signal.
Figure 4B:
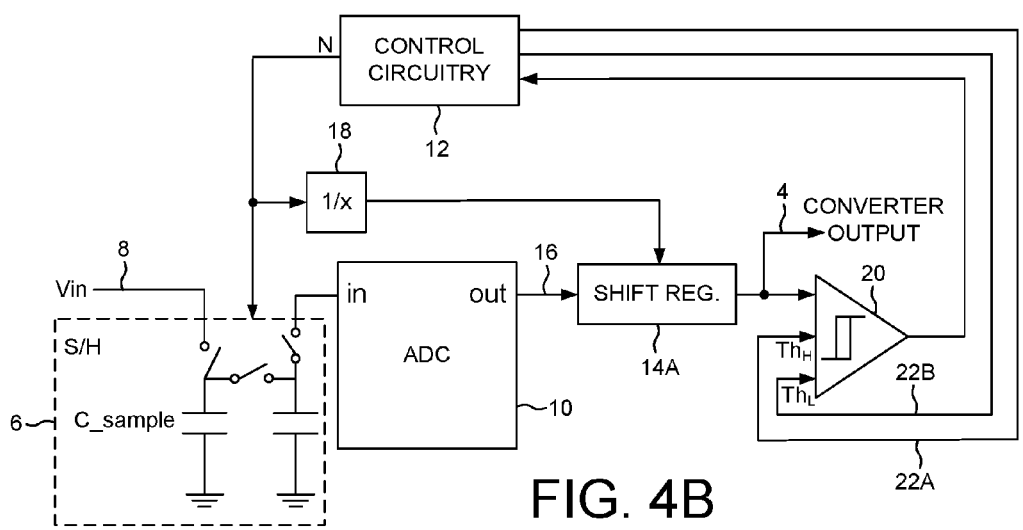
FIG. 4B shows an embodiment wherein the inverse of the attenuation factor N is a multiple of two so that a shift register may be used to multiply the output of the ADC by the inverse of the attenuation factor N.

FIG. 4A shows an example of the conversion circuitry output 4 of FIG. 1A relative to the amplitude of the input signal 8, including the real-time change in the resolution of the conversion circuitry 2 and corresponding change in the quantization step, as well as the hysteresis employed when real-time adjusting the gain/resolution. In this example, the ADC 10 of FIG. 1A is a 4-bit ADC to better illustrate the embodiment; however, any suitable N-bit ADC may be employed. When the amplitude of the input signal 8 increases such that the digital output signal 4 exceeds threshold $Th_1$, the gain and resolution of the conversion circuitry are decreased by an attenuation factor of N=½, the high threshold $Th_H$ 22A of comparator 20 is set to $Th_2$, and the low threshold $Th_L$ 22B is set to $Th_1$ minus an offset so as to achieve a suitable hysteresis. When the amplitude of the input signal 8 increases such that the digital output signal 4 exceeds threshold $Th_2$, the gain and the resolution are decreased by an attenuation factor of N=¼, and the low threshold $Th_L$ 22B of the comparator 20 is set to $Th_2$ minus an offset so as to achieve a suitable hysteresis. In this embodiment, the inverse of the attenuation factor N is a multiple of two which enables the multiplier 14 shown in FIG. 1A to be implemented as a shift register 14A as shown in FIG. 4B. That is, the output 16 of the ADC 10 may be stored in a shift register 14A, and the ADC output 16 multiplied by the inverse of the attenuation factor N by shifting the shift register 14A so as to multiply by a multiple of two.

Figure 5A:
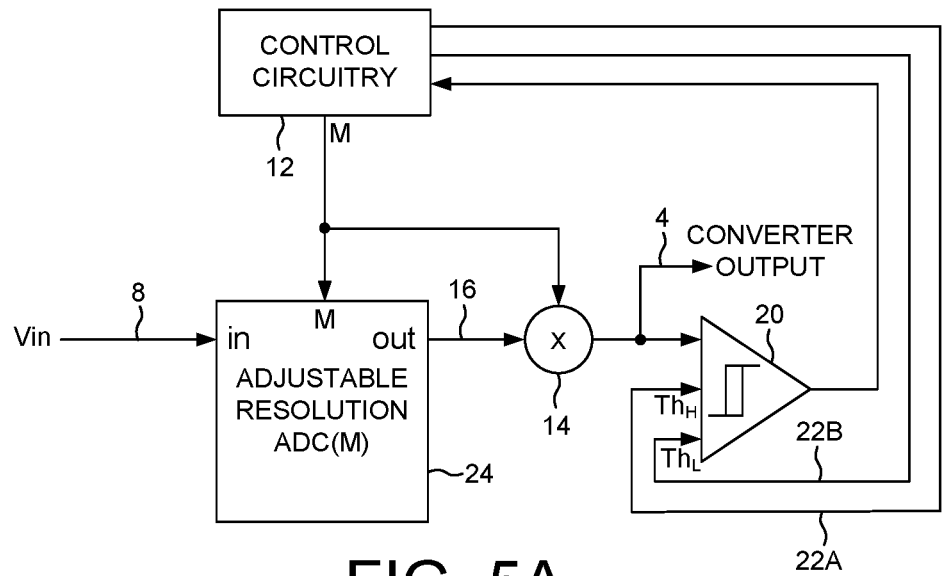
FIG. 5A shows an embodiment wherein to compensate in real-time for an increase in the amplitude of the input signal, the gain and resolution of the conversion circuitry are decreased by decreasing the resolution of an adjustable resolution ADC.

FIG. 5A shows an embodiment wherein to compensate in real-time for an increase in the amplitude of the input signal 8, the gain and resolution of the conversion circuitry are decreased by decreasing the resolution of an adjustable resolution ADC 24 by a resolution factor M. Any suitable adjustable resolution ADC 24 may be employed, wherein FIGS. 6A and 6B show an adjustable resolution SAR ADC according to an embodiment comprising a plurality of binary weighted capacitors forming a suitable capacitor network, including a plurality of active binary weighted capacitors and at least one inactive binary weighted capacitor. In this example, the SAR ADC comprises twelve binary weighted capacitors, wherein ten of the capacitors are active at a time so as to implement a 10-bit ADC with three resolution settings. In order to decrease the resolution by one step, the active binary weighted capacitors are shifted left by one binary weight. In the example of FIGS. 6A and 6B, the ten least significant capacitors are active (and the two most significant capacitors are inactive) so that the ADC is configured into its highest resolution mode (i.e., M=1).

FIG. 6A shows the SAR ADC 24 configured into a sample phase wherein the input voltage Vin is applied to the binary weighted capacitor network. During a conversion phase shown in FIG. 6B, the binary weighted capacitors are initially connected to the ground terminal, thereby forcing the voltage at the input terminal 26 of comparator 28 to Vcm−Vin. The bottom switches of the binary weighted capacitor network are then selectively connected to Vref in accordance with a SAR search algorithm in order to redistribute the charge across the capacitors and cause a corresponding change to the voltage at the input terminal 26. The search algorithm switches in/out the binary weighted capacitors until a combination of capacitors is found that causes the voltage at the input terminal 26 to substantially match the voltage Vcm, wherein the resulting switch pattern for this combination becomes the binary output 16 of the SAR ADC 24.

Figure 7A:
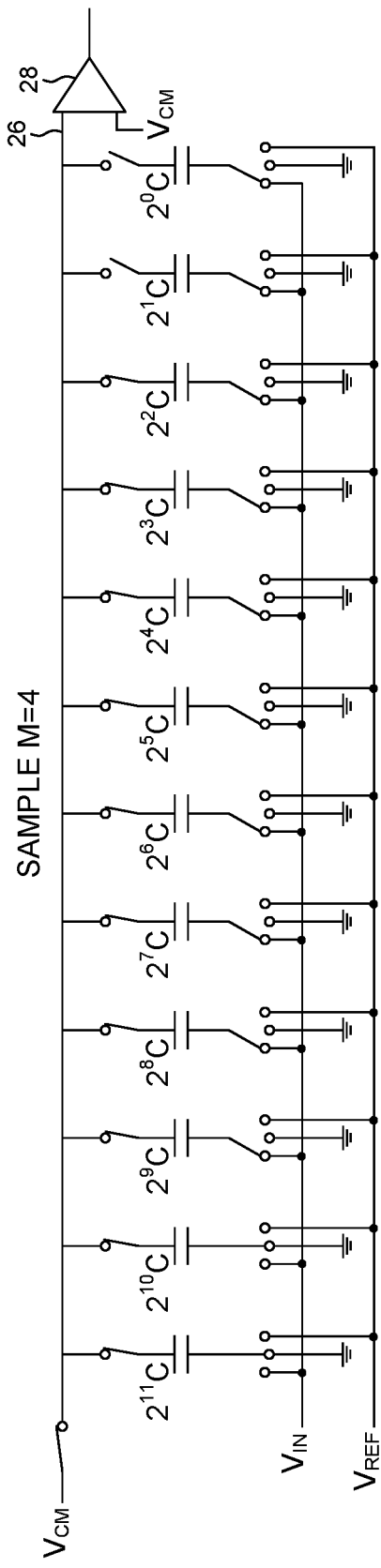
FIGS. 7A and 7B show an embodiment wherein a resolution of the SAR ADC is decreased by a factor of four by shifting the active binary weighted capacitors left by two binary weights.
Figure 7B:
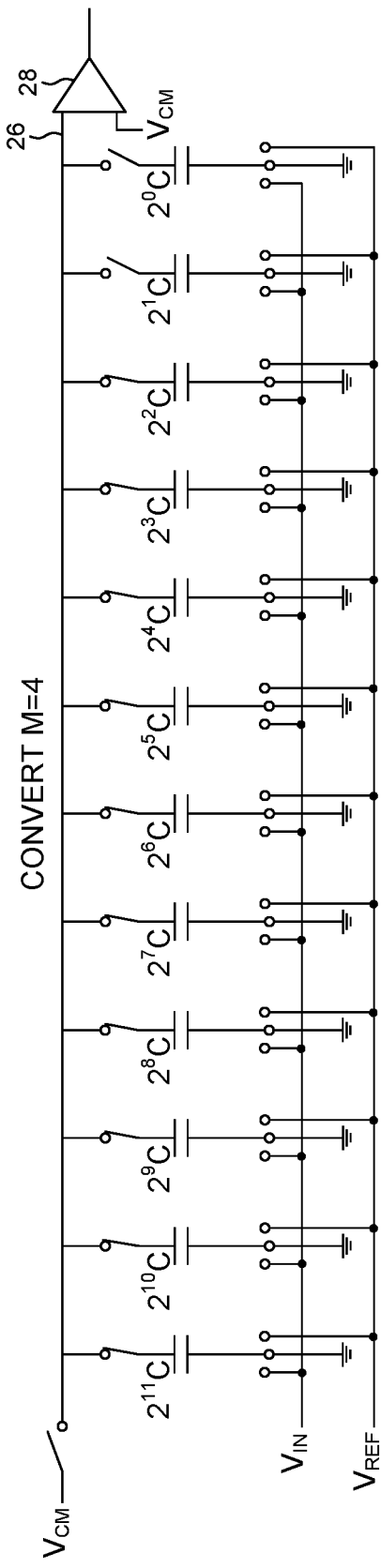

FIGS. 7A and 7B show an embodiment wherein the resolution of the SAR ADC 24 is decreased by two steps by shifting the active binary weighted capacitors left by two such that the ten most significant binary weighted capacitors are active and the two least significant binary weighted capacitors are inactive (i.e., M=4). In one embodiment, adjusting the resolution of the ADC as opposed to increasing the number of active binary weighted capacitors increases the conversion speed and reduces the power consumption of the SAR ADC 24. For example, the above-described SAR ADC comprises twelve binary weighted capacitors that could be used to implement a 12-bit ADC having a fixed resolution. However, converting the input voltage into a 12-bit binary value increases the conversion time (e.g., increases the SAR search time) as well as increases the power consumed by the binary weighted capacitor network. Accordingly in one embodiment the conversion speed is increased and the power consumption is decreased by implementing a 10-bit ADC having a resolution that scales inversely with the amplitude of the input signal. In the above-described example, the SAR ADC 24 is implemented as a 10/12-bit ADC having three resolution settings (M=1, M=2, M=4); however, a general embodiment employs an A/B-bit ADC having (B−A)+1 resolution settings.

Figure 5B:
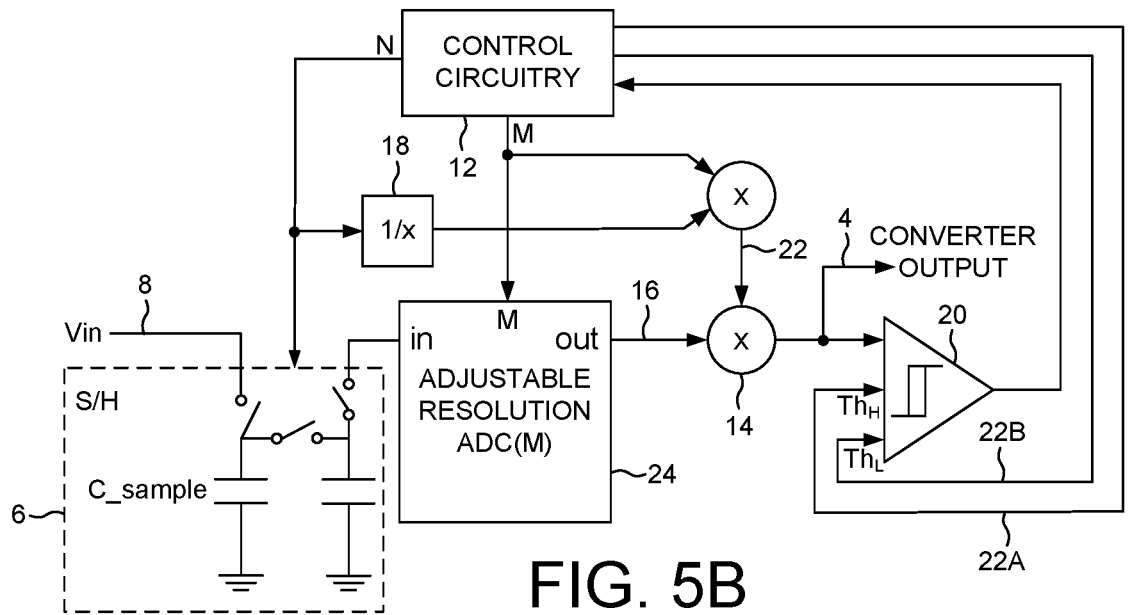
FIG. 5B shows an embodiment wherein both the sample capacitor of a sample-and-hold circuit is decreased and the resolution of an ADC is decreased in order to compensate in real-time for an increase in amplitude of the input signal.
Figure 8:
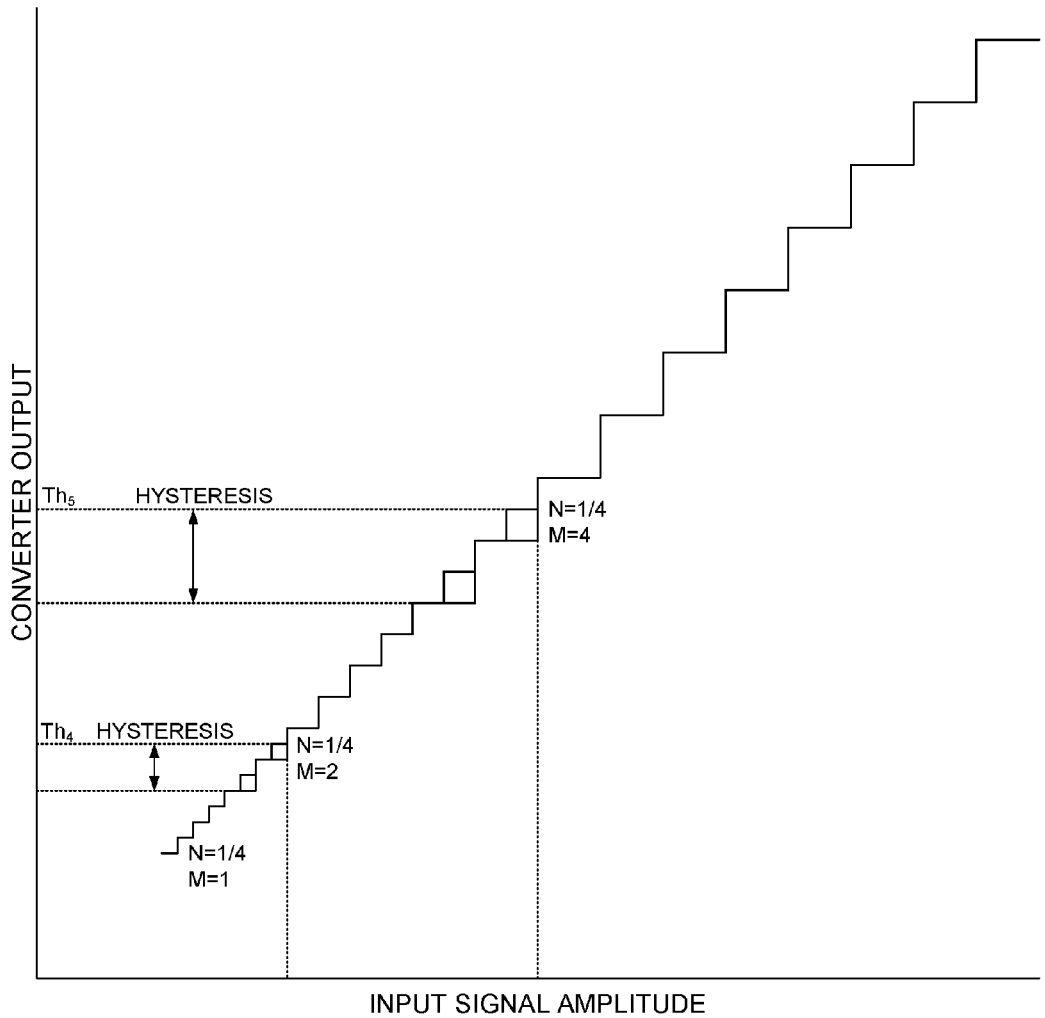
FIG. 8 shows an embodiment wherein the gain and resolution of the conversion circuitry is decreased by first decreasing the capacitance of a sample capacitor in a sample-and-hold circuit, and then decreasing the resolution of an adjustable resolution ADC to compensate in real-time for an increase in amplitude of the input signal.

FIG. 5B shows an embodiment which compensates in real-time for an increase in the amplitude of the input signal 8 by first decreasing the capacitance of a sample capacitor in a S/H circuit 6, and then decreasing the resolution of an adjustable resolution ADC 24. FIG. 8 shows an example of the conversion circuitry output 4 of FIG. 5B relative to the amplitude of the input signal 8, including the change in the resolution and corresponding change in the quantization step. In this embodiment, the resolution of the ADC 24 is not decreased until the attenuation factor N of the sample capacitor in the S/H circuit 6 reaches a minimum (N=¼ in this example). When the amplitude of the input signal 8 increases such that the digital output signal 4 exceeds threshold $Th_4$, the resolution of the ADC 24 is decreased by one step (M=2), the high threshold $Th_H$ 22A of comparator 20 is set to $Th_5$, and the low threshold $Th_L$ 22B is set to $Th_4$ minus an offset so as to achieve a suitable hysteresis. When the amplitude of the input signal 8 increases such that the digital output signal 4 exceeds threshold $Th_5$, the resolution of the ADC 24 is decreased by one step (M=4), and the low threshold $Th_L$ 22B of the comparator 20 is set to $Th_5$ minus an offset so as to achieve a suitable hysteresis.

Figure 9A:
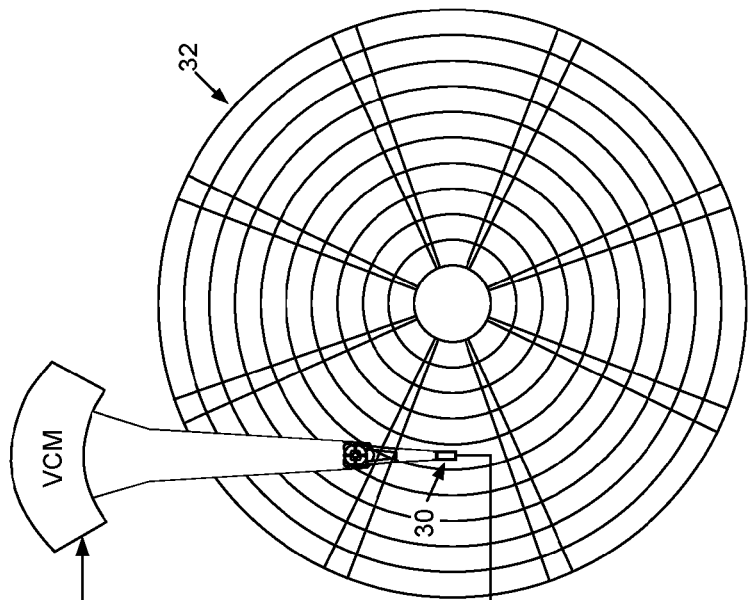
FIG. 9A shows a data storage device in the form of a disk drive according to an embodiment comprising a head actuated over a disk, and control circuitry including the analog-to-digital conversion circuitry of FIG. 1A.
Figure 9B:
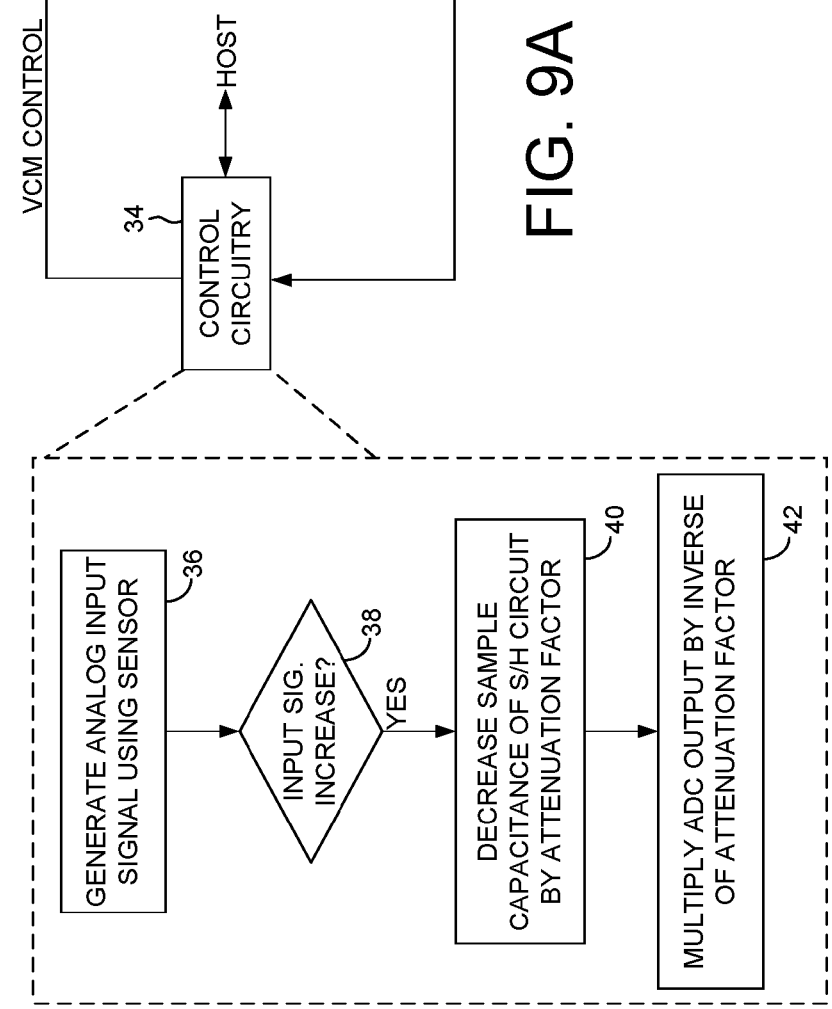
FIG. 9B is a flow diagram according to an embodiment executed by the control circuitry of the data storage device, wherein an increase in an amplitude of an analog input signal is compensated in real-time by decreasing the sample capacitance in the S/H circuit by an attenuation factor N, and multiplying the output of the ADC by the inverse of the attenuation factor N.

FIG. 9A shows a data storage in the form of a disk drive according to an embodiment comprising a head 30 actuated over a disk 32. The disk drive further comprises control circuitry 34 including the analog-to-digital conversion circuitry of FIG. 1A, wherein the control circuitry 34 is configured to execute the flow diagram of FIG. 9B. An analog input signal is generated using a suitable sensor, such as a shock sensor (block 36), and when an amplitude of the input signal increases (block 38), real-time compensation is performed by decreasing the sample capacitance of the sample-and-hold (S/H) circuit by an attenuation factor N (block 40), and multiplying the output of the ADC that is coupled to the S/H circuit by an inverse of the attenuation factor N (block 42).

Any suitable control circuitry may be employed in the above embodiments, such as any suitable integrated circuit or circuits which may or may not employ one or more passive external elements (e.g., one or more passive external capacitors). In one embodiment, the control circuitry comprises a microprocessor executing instructions to perform the operations described herein. The instructions may be stored in any computer-readable medium. In one embodiment, they may be stored on a non-volatile semiconductor memory external to the microprocessor, or integrated with the microprocessor in a SOC. In another embodiment, the instructions are stored in a non-volatile memory and read into a volatile semiconductor memory when powered on. In yet another embodiment, the control circuitry comprises suitable logic circuitry, such as state machine circuitry.

The various features and processes described above may be used independently of one another, or may be combined in various ways. All possible combinations and subcombinations are intended to fall within the scope of this disclosure. In addition, certain method, event or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other manner. Tasks or events may be added to or removed from the disclosed example embodiments. The example systems and components described herein may be configured differently than described. For example, elements may be added to, removed from, or rearranged compared to the disclosed example embodiments.

While certain example embodiments have been described, these embodiments have been presented by way of example only, and are not intended to limit the scope of the inventions disclosed herein. Thus, nothing in the foregoing description is intended to imply that any particular feature, characteristic, step, module, or block is necessary or indispensable. Indeed, the novel methods and systems described herein may be embodied in a variety of other forms; furthermore, various omissions, substitutions and changes in the form of the methods and systems described herein may be made without departing from the spirit of the embodiments disclosed herein.

What is claimed is:

1. Analog-to-digital conversion circuitry for generating a digital output signal, the analog-to-digital conversion circuitry comprising:
    a sample-and-hold circuit comprising an adjustable sample capacitor for coupling to an analog input signal during a sample phase;
    an analog-to-digital converter (ADC) coupled to an output of the sample-and-hold circuit during a hold phase; and
    control circuitry configured to compensate in real-time for an increase in an amplitude of the input signal by:
        decreasing a capacitance of the sample capacitor by an attenuation factor; and
        multiplying an output of the ADC by an inverse of the attenuation factor to generate the digital output signal.

2. The analog-to-digital conversion circuitry as recited in claim 1, wherein the control circuitry is configured to compensate in real-time for the increase in the amplitude of the input signal by decreasing the capacitance of the sample capacitor and multiplying the output of the ADC by the inverse of the attenuation factor when the digital output signal exceeds a first threshold.

3. The analog-to-digital conversion circuitry as recited in claim 2, wherein the control circuitry is further configured to compensate in real-time for a decrease in the amplitude of the input signal by increasing the capacitance of the sample capacitor when the digital output signal falls below a second threshold less than the first threshold.

4. The analog-to-digital conversion circuitry as recited in claim 3, wherein the second threshold is a hysteretic threshold.

5. The analog-to-digital conversion circuitry as recited in claim 1, wherein:
    the sample-and-hold circuit comprises a plurality of capacitors connected in parallel; and
    the control circuitry is configured to decrease the capacitance of the sample capacitor by disconnecting at least one of the capacitors during the sample phase.

6. The analog-to-digital conversion circuitry as recited in claim 5, wherein each of the plurality of capacitors comprises a substantially equal capacitance.

7. The analog-to-digital conversion circuitry as recited in claim 1, wherein:
the inverse of the attenuation factor is a multiple of two; and
the control circuitry comprises a shift register configured to multiply the output of the ADC by the inverse of the attenuation factor by shifting the shift register.

8. A method of converting an analog input signal into a digital output signal, the method comprising compensating in real-time for an increase in an amplitude of the input signal by:
decreasing by an attenuation factor a capacitance of a sample capacitor in a sample-and-hold (S/H) circuit configured to sample the analog input signal; and
multiplying by an inverse of the attenuation factor an output of an analog-to-digital converter (ADC) coupled to the S/H circuit to generate the digital output signal.

9. The method as recited in claim 8, further comprising compensating in real-time for the increase in the amplitude of the input signal by decreasing the capacitance of the sample capacitor and multiplying the output of the ADC by the inverse of the attenuation factor when the digital output signal exceeds a first threshold.

10. The method as recited in claim 9, further comprising compensating in real-time for a decrease in the amplitude of the input signal by increasing the capacitance of the sample capacitor when the digital output signal falls below a second threshold less than the first threshold.

11. The method as recited in claim 10, wherein the second threshold is a hysteretic threshold.

12. The method as recited in claim 8, wherein:
the sample-and-hold circuit comprises a plurality of capacitors connected in parallel; and
decreasing the capacitance of the sample capacitor comprises disconnecting at least one of the capacitors during the sample phase.

13. The method as recited in claim 12, wherein each of the plurality of capacitors comprises a substantially equal capacitance.

14. The method as recited in claim 8, wherein:
the inverse of the attenuation factor is a multiple of two; and
multiplying the output of the ADC by the inverse of the attenuation factor comprises shifting a shift register.

15. A data storage device comprising:
a head actuated over a disk;
analog-to-digital conversion circuitry for generating a digital output signal, the analog-to-digital conversion circuitry comprising:
a sample-and-hold circuit comprising an adjustable sample capacitor for coupling to an analog input signal during a sample phase; and
an analog-to-digital converter (ADC) coupled to an output of the sample-and-hold circuit during a hold phase; and
control circuitry configured to compensate in real-time for an increase in an amplitude of the input signal by:
decreasing a capacitance of the sample capacitor by an attenuation factor; and
multiplying an output of the ADC by an inverse of the attenuation factor to generate the digital output signal.

16. The data storage device as recited in claim 15, further comprising a shock sensor outputting the analog input signal.

* * * * *